(12) United States Patent
Ito

(10) Patent No.: US 8,999,063 B2
(45) Date of Patent: Apr. 7, 2015

(54) SUSCEPTOR, SEMICONDUCTOR MANUFACTURING APPARATUS, AND SEMICONDUCTOR MANUFACTURING METHOD

(75) Inventor: Hideki Ito, Shizuoka (JP)

(73) Assignee: NuFlare Technology, Inc., Shizuoka (JP)

( * ) Notice: Subject to any disclaimer, the term of this patent is extended or adjusted under 35 U.S.C. 154(b) by 960 days.

(21) Appl. No.: 12/434,317

(22) Filed: May 1, 2009

(65) Prior Publication Data

US 2009/0272323 A1 Nov. 5, 2009

(30) Foreign Application Priority Data

May 2, 2008 (JP) ................................. 2008-120159

(51) Int. Cl.
| | |
|---|---|
| C23C 16/50 | (2006.01) |
| C23C 16/00 | (2006.01) |
| C23F 1/00 | (2006.01) |
| H01L 21/306 | (2006.01) |
| C23C 16/458 | (2006.01) |
| C23C 16/46 | (2006.01) |
| C30B 25/12 | (2006.01) |
| H01L 21/687 | (2006.01) |

(52) U.S. Cl.
CPC ............ *C23C 16/4583* (2013.01); *C23C 16/46* (2013.01); *C30B 25/12* (2013.01); *H01L 21/68735* (2013.01); *H01L 21/6875* (2013.01)

(58) Field of Classification Search
USPC ................. 118/728–733; 156/345.51–345.55
See application file for complete search history.

(56) References Cited

U.S. PATENT DOCUMENTS

| | | | | | |
|---|---|---|---|---|---|
| 5,584,936 | A | * | 12/1996 | Pickering et al. ............. | 118/728 |
| 5,820,686 | A | * | 10/1998 | Moore ......................... | 118/730 |
| 6,001,183 | A | * | 12/1999 | Gurary et al. ................. | 118/720 |
| 6,048,403 | A | * | 4/2000 | Deaton et al. ................. | 118/725 |
| 6,113,984 | A | | 9/2000 | MacLeish et al. | |
| 6,454,865 | B1 | * | 9/2002 | Goodman et al. ............ | 118/728 |
| 7,393,417 | B1 | * | 7/2008 | Maeda et al. ................ | 118/725 |
| 2002/0043337 | A1 | | 4/2002 | Goodman et al. | |
| 2006/0075972 | A1 | * | 4/2006 | Nakashima et al. .......... | 118/729 |

FOREIGN PATENT DOCUMENTS

| | | |
|---|---|---|
| JP | 2000-043302 | 2/2000 |
| JP | 2000-164588 | 6/2000 |
| JP | 2002-151412 | 5/2002 |
| JP | 2003-45806 | 2/2003 |

(Continued)

OTHER PUBLICATIONS

Office Action issued by the Korean Patent Office on Feb. 18, 2011, for Korean Patent Application No. 10-2009-0033625, and English-language translation thereof.

(Continued)

*Primary Examiner* — Maureen Gramaglia
*Assistant Examiner* — Tiffany Nuckols
(74) *Attorney, Agent, or Firm* — Finnegan, Henderson, Farabow, Garrett & Dunner, L.L.P.

(57) ABSTRACT

A susceptor includes a first step portion on which a wafer is placed; and a convex portion placed on a bottom surface of the first step portion, wherein a void is formed between a top surface of the convex portion and a rear surface of the wafer in a state in which the wafer is placed on the top surface of the convex portion.

6 Claims, 4 Drawing Sheets

(56) References Cited

FOREIGN PATENT DOCUMENTS

| JP | 2009-70915 | 4/2009 |
|----|------------|--------|
| KR | 1998-018624 | 6/1998 |
| KR | 2002-0031417 | 5/2002 |

OTHER PUBLICATIONS

Notice Decision of Final Rejection issued by the Korean Patent Office on Aug. 25, 2011, for Korean Patent Application No. 10-2009-0033625, and English-language translation thereof.

Notification of Reason(s) for Refusal issued by the Japanese Patent Office on Aug. 7, 2012, for Japanese Patent Application No. 2008-120159, and English-language translation thereof.

Office Action issued by the Taiwanese Patent Office on Aug. 28, 2012, for Taiwanese Patent Application No. 098114433, and English-language translation thereof.

Notification of Reason(s) for Refusal issued by the Japanese Patent Office on Oct. 1, 2013, for Japanese Patent Application No. 2012-222768, and English-language translation thereof.

\* cited by examiner

SUSCEPTOR, SEMICONDUCTOR MANUFACTURING APPARATUS, AND SEMICONDUCTOR MANUFACTURING METHOD

CROSS-REFERENCE TO RELATED APPLICATION

This application is based upon and claims the benefit of priority from prior Japanese Patent Application No. 2008-120159 filed on May 2, 2008 in Japan, the entire contents of which are incorporated herein by reference.

BACKGROUND OF THE INVENTION

1. Field of the Invention

The present invention relates to a susceptor, a semiconductor manufacturing apparatus, and a semiconductor manufacturing method which are used to supply a reaction gas to a front surface of, for example, a semiconductor wafer while heating the semiconductor wafer from a rear surface thereof to perform film formation and which are to hold the semiconductor wafer.

2. Related Art

In general, in a CVD (Chemical Vapor Deposition) apparatus used in formation of an epitaxial film in semiconductor manufacturing steps, a heat source and a rotating mechanism are arranged under a wafer, and a rear-surface heating method which can supply a uniform process gas from the top is used.

In recent years, with miniaturization and advance in function of a semiconductor device, a high level of prevention of metal contamination in a film forming step is required. In the above rear-surface heating method, the heat source and the rotating mechanism are arranged under the wafer, and the heat source and the rotating mechanism are not completely separated from each other. Therefore, the wafer is disadvantageously contaminated by diffusion and movement of metal atoms.

In general, a wafer is held by a susceptor in a deposition apparatus (reaction chamber) and moved upward by a push-up pin penetrating a pin hole formed in the susceptor in conveyance. Therefore, the wafer cannot be easily blocked from being contaminated, in particular, through the pin hole.

On the other hand, for example, in Published Unexamined Japanese Patent Application Publication No. 2000-43302 (JP-A-2000-43302), in order to try to make a wafer temperature distribution uniform, a susceptor having a structure in which no pin hole is formed is proposed. However, when the susceptor structure which is free from a pin hole is actually used, a gas-phase layer is formed under the wafer when the wafer is to be placed, and the wafer is floated. Therefore, the wafer cannot be stably held. Furthermore, when film formation is performed by heating and rotating the wafer and supplying a process gas, uniform film formation is difficult in such an unstable state. In order to perform uniform film formation, the wafer may deviate from a susceptor placing position in high-speed rotation, and uniform film formation by the high-speed rotation is disadvantageously difficult.

As described above, when the susceptor structure which is free from a pin hole is employed to block the wafer from being contaminated through a pin hole formed in the susceptor, it is disadvantageously difficult that uniform film formation is performed while stably holding the wafer.

The present inventors previously proposes a susceptor, a semiconductor manufacturing apparatus, and a semiconductor manufacturing method which suppresses metal contamination in the film forming step, can uniformly form a film on a wafer, can suppress a yield from decreasing, and can improve the reliability of a semiconductor device (Japanese Patent Application No. 2007-235685 (JP2007-235685) is incorporated) Note that JP 2007-235685 does not have been disclosed.

A susceptor structure of the above undisclosed previous application (JP 2007-235685) includes: an inner susceptor having a size smaller than a diameter of a wafer and a surface on which a convex portion to place the wafer is formed; and an outer susceptor having a first step portion having an opening at the center to place the inner susceptor to block the opening and a second step portion formed on an upper stage of the first step portion to place the wafer.

A semiconductor manufacturing apparatus of the above undisclosed previous application (JP 2007-235685) includes: a reaction chamber into which a wafer is conveyed; a gas supply mechanism to supply a process gas into the reaction chamber; a gas exhausting mechanism to exhaust the process gas from the reaction chamber; an inner susceptor having a size smaller than a diameter of the wafer and a surface on which a convex portion to place the wafer is formed; an outer susceptor having a first step portion having an opening at the center to place the inner susceptor to block the opening and a second step portion formed on an upper stage of the first step portion to place the wafer; a heater to heat the wafer from lower portions of the inner susceptor and the outer susceptor; a rotating mechanism to rotate the wafer; and a push-up pin which penetrates the heater to vertically move the inner susceptor.

In the susceptor and the semiconductor manufacturing apparatus of the above undisclosed previous application (JP 2007-235685), metal contamination in the film forming step can be suppressed while temperature control is not sufficiently performed, and a fluctuation in thickness of a formed film is generated.

BRIEF SUMMARY OF THE INVENTION

An embodiment of the present invention provides a semiconductor manufacturing apparatus and a semiconductor manufacturing method which use a susceptor configuration a temperature of which can be controlled and minimize a fluctuation in film thickness of a formed film to improve productivity.

In accordance with one aspect of this invention, a susceptor includes a first step portion on which a wafer is placed; and a convex portion placed on a bottom surface of the first step portion, wherein a void is formed between a top surface of the convex portion and a rear surface of the wafer in a state in which the wafer is placed on the top surface of the convex portion.

In accordance with another aspect of this invention, a susceptor includes an inner susceptor configured to have a size smaller than a diameter of a wafer and a surface on which a convex portion is formed; and an outer susceptor configured to have a first step portion having an opening at the center and on which the inner susceptor blocking the opening is placed, and a second step portion formed on an upper stage of the first step portion to place the wafer, wherein a void is formed between a top surface of the convex portion and a rear surface of the wafer in a state in which the wafer is placed on the top surface of the convex portion.

In accordance with a further aspect of the invention, a semiconductor manufacturing apparatus includes a reaction chamber into which a wafer is conveyed; a gas supply mechanism configured to supply a process gas into the reaction chamber; a gas exhausting mechanism configured to exhaust the process gas from the reaction chamber; an inner susceptor configured to have a size smaller than a diameter of the wafer and a surface on which a convex portion is formed; an outer susceptor configured to have a first step portion having an opening at the center and on which the inner susceptor blocking the opening is placed, and a second step portion formed on an upper stage of the first step portion to place the wafer; a heater configured to heat the wafer from lower side of the inner susceptor and the outer susceptor; a rotating mechanism configured to rotate the wafer; and a push-up pin configured to penetrate the heater and to vertically move the inner susceptor, wherein a void is formed between a top surface of the convex portion and a rear surface of the wafer in a state in which the wafer is placed on the top surface of the convex portion.

In accordance with a further aspect of the invention, a semiconductor manufacturing method includes conveying a wafer into a reaction chamber; moving upward an inner susceptor arranged in the reaction chamber and having a size smaller than a diameter of the wafer and a surface on which a convex portion is formed with a push-up pin, and placing the wafer on the inner susceptor to form a void between a top surface of the convex portion and a rear surface of the wafer; moving downward the push-up pin and placing the inner susceptor on a first step portion of an outer susceptor having an opening at the center to block the opening and placing the wafer on a second step portion formed on an upper stage of the first step portion of the outer susceptor; heating the wafer through the inner susceptor and the outer susceptor; rotating the wafer; and supplying a process gas onto the wafer.

DETAILED DESCRIPTION OF THE INVENTION

Embodiment 1

An embodiment of the present invention will be described below with reference to the accompanying drawings.

Figure 1:
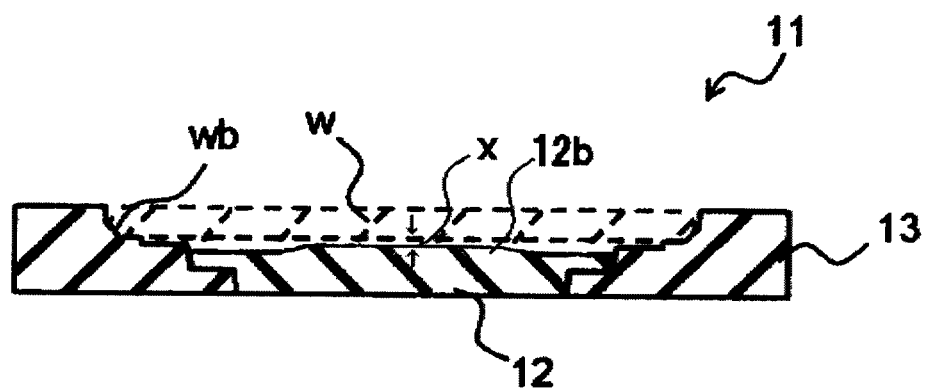
FIG. 1 is a sectional view of a susceptor according to an embodiment of the present invention.

FIG. 1 shows a sectional view of a susceptor according to the embodiment. As shown in FIG. 1, a susceptor 11 includes an inner susceptor 12 and an outer susceptor 13 which can be separated from the inner susceptor 12.

Figure 2:
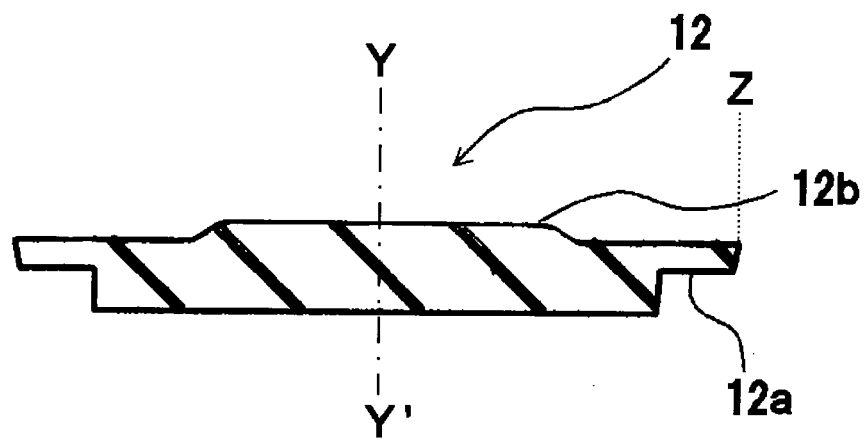
FIG. 2 is a sectional view of an inner susceptor according to an embodiment of the present invention.

On the inner susceptor 12, as shown in FIG. 2, a step portion 12a is formed on an edge portion to have a size smaller than a diameter of a wafer w to be placed. On an upper surface of the step portion 12a, a disk-like convex portion 12b having, for example, a planar top surface is formed. The disk-like convex portion 12b is arranged to have a void (x) between a rear surface of the wafer w and the top surface (the top surface has a planar portion) of the convex portion 12b while the wafer w is placed. A size of the void (x) varies depending on a temperature distribution in a lateral direction of the wafer w. In FIG. 2, a center line serving as a center of the inner susceptor 12 is indicated by a Y-Y' line, and a circumference of the inner susceptor 12 is indicated by Z.

Figure 3:
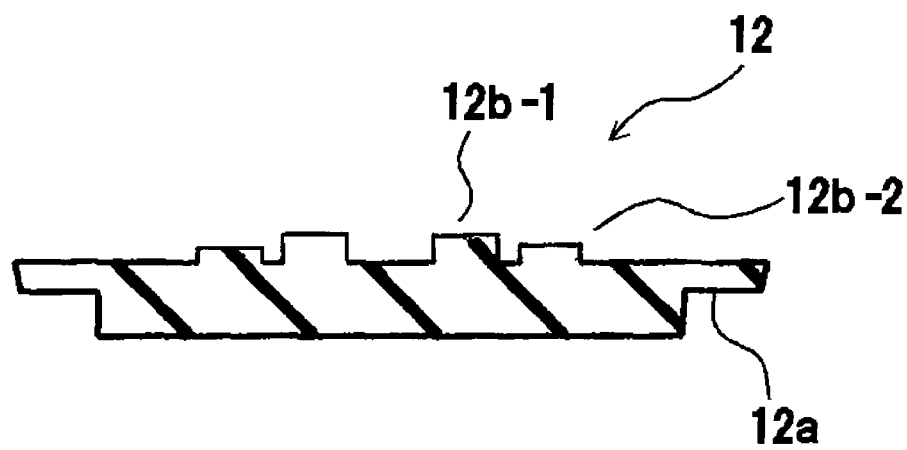
FIG. 3 is a sectional view of another inner susceptor according to an embodiment of the present invention.
Figure 4:
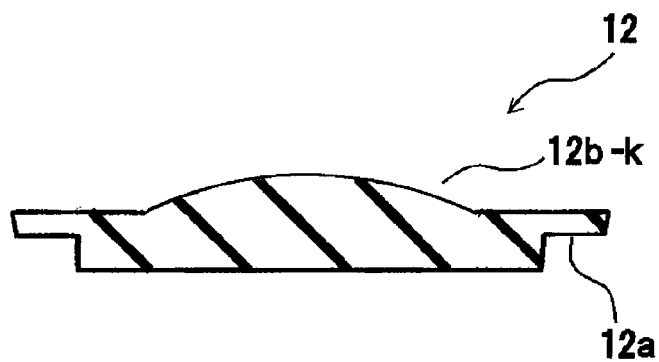
FIG. 4 is a sectional view of still another inner susceptor according to an embodiment of the present invention.
Figure 5:
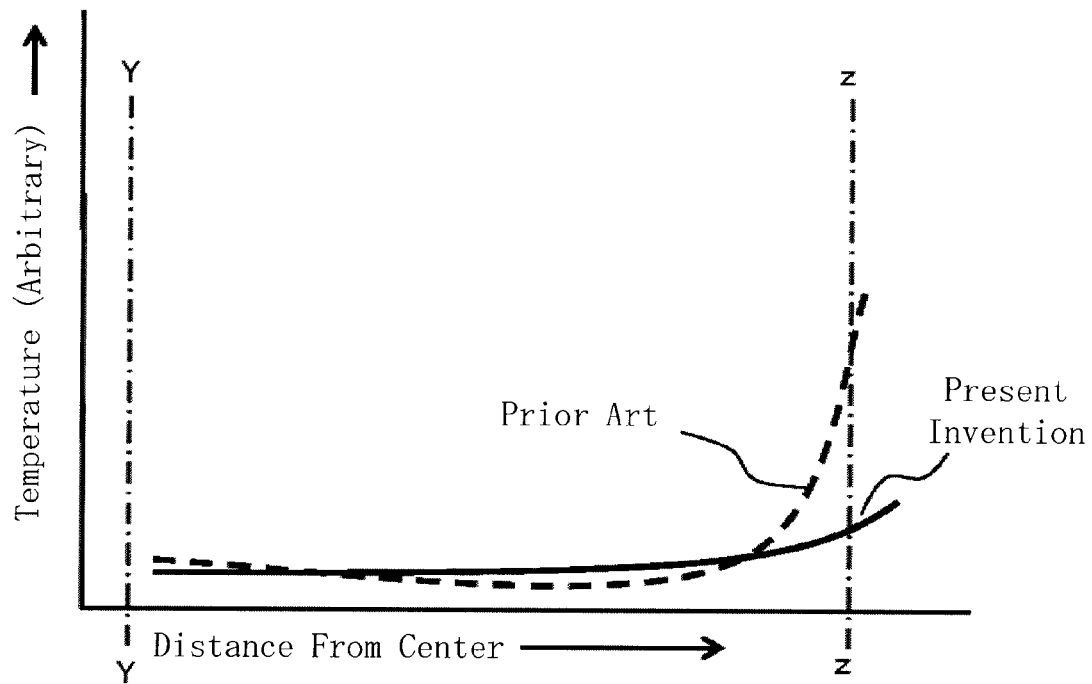
FIG. 5 is a graph showing an in-plane temperature distribution of a wafer according to an embodiment of the present invention.

In the susceptor 11, depending on the temperature distribution in the lateral direction of the wafer w, as an annular (ring-like) convex portion 12b may be formed, or double (12b-1 and 12b-2) or triple (not shown) ring-like convex portions may be formed as shown in FIG. 3 to change a distance between the convex portions and the wafer w little by little. Furthermore, as shown in FIG. 4, the disk-like top surface of the convex portion 12b may be configured not to have a planar surface but to have a curved surface having a curvature (12b-k). The disk-like convex portion 12b need not be formed integrally with a susceptor body, and a plate having, for example, a doughnut shaped may be independently formed to form the disk-like convex portion 12b. The shape is desirably changed depending on a temperature distribution. Temperature distributions of the wafer w in the present invention (solid line) and a conventional art (dotted line) are shown in FIG. 5. As is apparent from FIG. 5, the temperature of the wafer w can be controlled to 3° C. or less. As in the present invention, in a susceptor having a so-called conventional configuration in which the disk-like convex portion 12b is not formed, a temperature difference between the central portion and the circumferential portion is 10° C. or more, and a uniform film thickness is rarely obtained.

Figure 6:
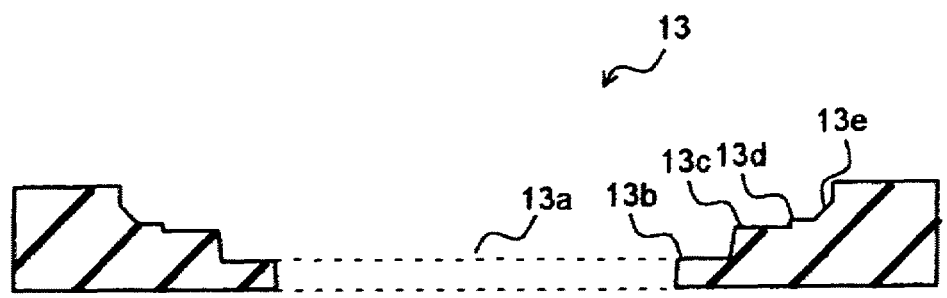
FIG. 6 is a sectional view of an outer susceptor according to an embodiment of the present invention.

In the outer susceptor 13, as shown in FIG. 6, an opening 13a is formed in a central portion, and step portions 13b, 13c, and 13d are formed on an edge portion of the opening 13a. The inner susceptor 12 is placed on the lower step portion 13b to block the opening 13a, a small gap having a size of, for example, about 0.2 mm is formed between the intermediate step portion 13c and the wafer w by the intermediate step portion 13c, and the wafer w is placed on the uppermost step portion 13d. In a portion of the step portion 13d on which a bevel portion $w_b$ of the wafer w is placed, a taper 13e is formed to have an angle almost equal to a bevel taper angle of, for example, 22°.

As described above, as the susceptor configuration, a susceptor has an inner susceptor having a size smaller than a diameter of a wafer and a surface on which a convex portion is formed and an outer susceptor having a first step portion having an opening at the center to place the inner susceptor to block the opening and a second step portion formed on an upper stage of the first step portion to place the wafer. A void is formed between a top surface of the convex portion and a rear surface of the wafer in a state in which the wafer is placed on the top surface of the convex portion.

The first step portion or the second step portion is desirably configured by a plurality of step portions.

The susceptor 11 described above is placed in a semiconductor manufacturing apparatus and used as described below.

Figure 7:
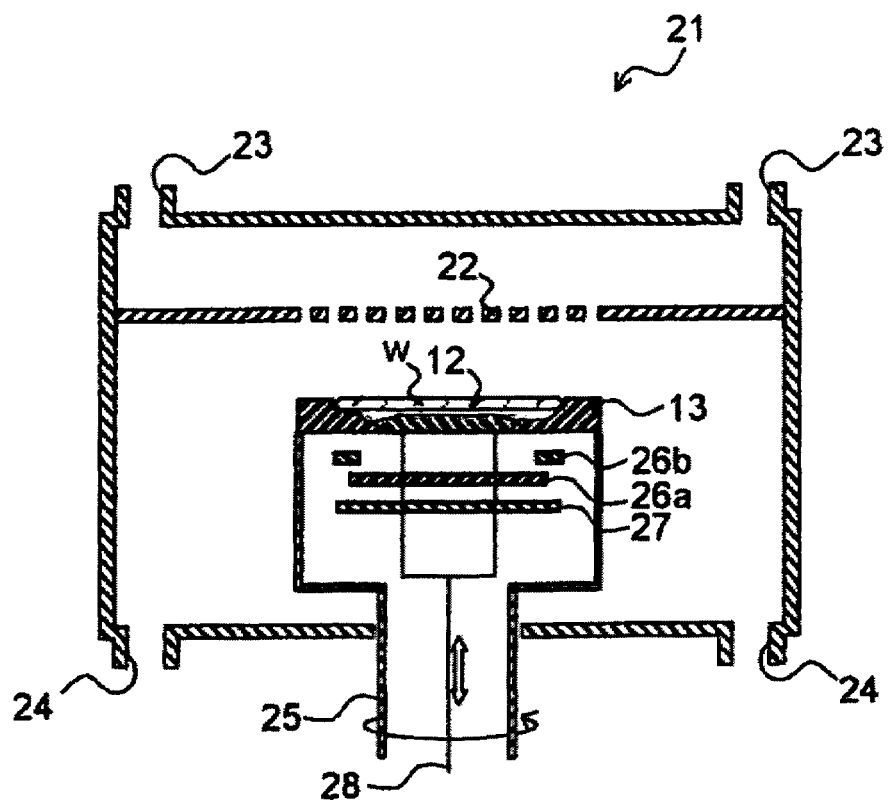
FIG. 7 is a sectional view of a semiconductor manufacturing apparatus according to an embodiment of the present invention.

FIG. 7 shows a sectional view of the semiconductor manufacturing apparatus. As shown in FIG. 7, in a reaction chamber 21 in which a film forming process is performed to a wafer w, a gas supply port 23 to supply a process gas onto the wafer w from the top of the reaction chamber 21 through a rectifying plate 22, and a gas exhaust port 24 to exhaust the process gas from the bottom of the reaction chamber 21 are arranged. Under the reaction chamber 21, a drive mechanism (not shown) is arranged outside the reaction chamber 21, and a rotating mechanism 25 to rotate the wafer w is arranged. The rotating mechanism 25 is connected to the susceptor 11 and the circumference portion of the outer susceptor 13 in the above configuration.

Under the susceptor 11, an in-heater 26a to heat the wafer w is arranged, and an out-heater 26b to heat an edge portion of the wafer w is arranged between the susceptor 11 and the in-heater 26a. The in-heater 26a and the out-heater 26b are controlled by a temperature control mechanism (not shown) on the basis of a wafer temperature measured by a temperature measurement mechanism (not shown). Under the in-heater 26a, a disk-like reflector 27 is arranged. A push-up pin 28 to vertically move the inner susceptor 12 is arranged to penetrate the in-heater 26a and the disk-like reflector 27.

Figure 8:
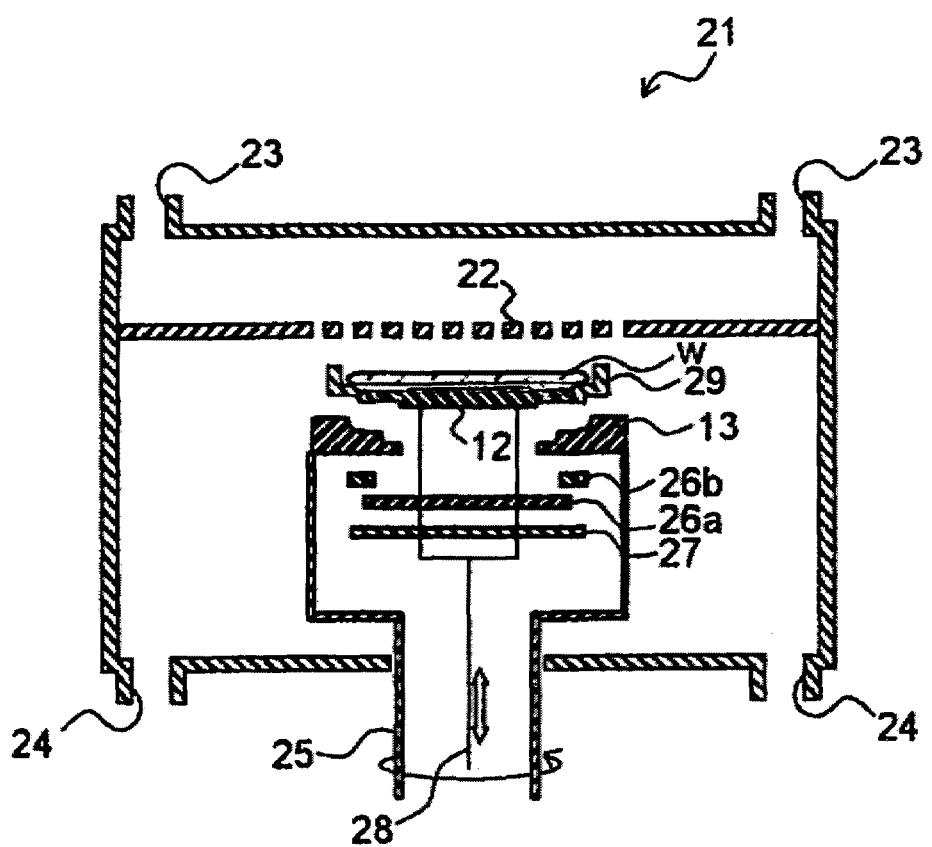
FIG. 8 is a sectional view of a semiconductor manufacturing apparatus according to an embodiment of the present invention.

By using the semiconductor manufacturing apparatus described above, for example, an Si epitaxial film is formed on the wafer w. As shown in FIG. 8, a 12-inch wafer w is held by a conveying arm 29 at the circumference portion and conveyed into the reaction chamber 21. The inner susceptor 12 is moved upward by the push-up pin 28. At this time, the wafer w is held by the conveying arm 29 outside the inner susceptor 12. The inner susceptor 12 is moved upward to place the wafer w on the inner susceptor 12. The inner susceptor 12 is downward moved by the push-up pin 28 to cause the outer susceptor 13 to hold the wafer w and the inner susceptor 12.

At this time, the wafer w is placed on the convex portion 12b of the inner susceptor 12, a void is formed between the lower portion of the wafer w and the inner susceptor 12. The step portion 12a of the inner susceptor is placed on the step portion 13b of the outer susceptor 13, and the wafer w is placed on the step portion 13d to form a small gap between the wafer w and the step portion 13c.

On the basis of a temperature of the wafer w measured by the temperature measurement mechanism (not shown), temperatures of the in-heater 26a and the out-heater 26b are arbitrarily controlled by the temperature control mechanism (not shown) within the range of, for example, 1400 to 1500° C. to control the temperature of the wafer w to, for example, 1100° C. in the plane uniformly. This in-plane uniformity depends on the shape of the convex portion described above. However, a temperature of the disk-like convex portion in FIG. 2 is about ±2° C. to 3° C. Furthermore, the wafer w is rotated by the rotating mechanism 25 at, for example, 900 rpm.

From the gas supply port 23, a process gas containing, for example, 20 to 100 SLM of a carrier gas: $H_2$, 50 sccm to 2 SLM of a film forming gas: $SiHCl_3$, small amounts of dopant gases: $B_2H_6$ and $PH_3$ is fed onto the rectifying plate 22 and supplied onto the wafer w while being rectified. At this time, a pressure in the reaction chamber 21 is controlled to, for example, 1333 Pa (10 Torr) to atmospheric pressure by adjusting a valve of the gas supply port 23 and the gas exhaust port 24. In this manner, the conditions are controlled, and an epitaxial film is formed on the wafer w.

By using the susceptor, the semiconductor manufacturing apparatus, and the semiconductor manufacturing method according to the embodiment of the present invention, temperature control in film formation becomes possible, and a fluctuation in film thickness of a formed film becomes very small. Consequently, the productivity can be improved.

In the susceptor configuration (inner susceptor itself is pushed up by the push-up pin) according to the embodiment, metal contamination in the film forming step can also be suppressed.

In the epitaxial film formed as described above, a diffusion length of Fe was measured by an SPV (Surface Photovoltage) method. As a result of the measurement, when a conventional susceptor having a pin hole is used, the diffusion length is insufficient. On the other hand, as in the present invention, when a susceptor in which a pin hole is not formed is used, the diffusion length is sufficient (for example 400 μm) to make it possible to suppress metal contamination.

Since the step portion 13d has the taper 13e having an angle substantially equal to the bevel taper angle of the wafer w, the wafer w can be more stabilized on the bevel portion $w_b$. Furthermore, since a small gap can be formed between the wafer w and the outer susceptor 13 by the step portion 13c, even though warpage occurs in the wafer w, the circumference of the wafer can be stably held. As a result, a uniform epitaxial film having a fluctuation in film thickness of, for example, 0.5% or less can be formed on the wafer.

When a semiconductor device is formed through the element forming step and the element isolation step, a fluctuation in element characteristic can be suppressed, and an yield and reliability can be improved. In particular, the invention is applied to the epitaxial forming step for a power semiconductor device such as a power MOSFET or an IGBT (Insulating Gate-type Bipolar Transistor) in which a film having a film thickness of about several 10 μm to 100 μm must be grown in an N-type base region, a P-type base region, an insulating isolation region, or the like, so that a preferable element characteristic can be obtained.

In the embodiment, as shown in FIG. 1, although the step portions of the inner susceptor 12 and the outer susceptor 13 are formed, the number of steps and step differences may be arbitrarily designed. The step portions may arbitrarily have tapers, respectively. The susceptor may be configured by only the outer susceptor 13. That is, a convex portion may be formed on the outer susceptor 13 itself without forming the inner susceptor 12.

For example, in the susceptor 11, each engaged portion of the inner susceptor 12 and the outer susceptor 13 may have two steps. When the multi-step structure is used, a contamination material can be suppressed from passing from a susceptor rear-surface side, and the wafer can be effectively suppressed from being contaminated with a metal.

In the embodiment, formation of an Si single-crystal layer (epitaxial growth layer) is described. However, the present invention can also be applied in formation of a poly-Si layer. Furthermore, the present invention can also be applied to another compound semiconductor such as a GaAs layer, a GaAlAs layer, and an InGaAs layer. The present invention can also applied in formation of an $SiO_2$ film or an $Si_3N_4$ film. In formation of the $SiO_2$ film, in addition to monosilane ($SiH_4$), $N_2$, $O_2$, and Ar gases are supplied. In formation of the $Si_3N_4$ film, in addition to monosilane ($SiH_4$), $NH_3$, $N_2$, $O_2$, Ar gases, and the like are supplied. Various modifications may be made without departing from the spirit and scope of the invention.

Additional advantages and modification will readily occur to those skilled in the art. Therefore, the invention in its broader aspects is not limited to the specific details and the representative embodiment shown and described herein. Accordingly, various modifications may be made without departing from the spirit or scope of the general inventive concept as defined by the appended claims and their equivalents.

What is claimed is:

1. A susceptor for holding a wafer, the susceptor comprising:

an inner susceptor having a diameter smaller than a diameter of the wafer, the inner susceptor comprising a first surface and a convex portion formed on the first surface, the convex portion for temporary placement thereon of the wafer; and an outer susceptor comprising:
a first step portion having:
an opening at the center of the first step portion, the opening being blocked by the inner susceptor, and
a first upper stage;
a second step portion having a second upper stage, the second step portion being formed above the first upper stage, and the second upper stage receiving the wafer from the convex portion, wherein a void is formed between a top surface of the convex portion and the rear surface of the wafer when the second upper stage receives the wafer.

2. The susceptor according to claim 1, wherein the convex portion is formed to have a high central portion and a low peripheral portion.

3. The susceptor according to claim 2, wherein the high central portion of the convex portion is formed to have a planar disk-like shape.

4. A semiconductor manufacturing apparatus comprising:
a reaction chamber into which a wafer is conveyed;
a gas supply mechanism configured to supply a process gas into the reaction chamber;
a gas exhausting mechanism configured to exhaust the process gas from the reaction chamber;
an inner susceptor having a diameter smaller than a diameter of the wafer, the inner susceptor comprising a first surface and a convex portion formed on the first surface, the convex portion for temporary placement thereon of the wafer; and an outer susceptor comprising:
a first step portion having:
an opening at the center of the first step portion, the opening being blocked by the inner susceptor, and
a first upper stage; and
a second step portion having a second upper stage, the second step portion being formed above the first upper stage, and the second upper stage receiving the wafer from the convex portion, wherein a void is formed between a to surface of the convex portion and the rear surface of the wafer when the second upper stage receives the wafer;
a heater configured to heat the wafer from a lower side of the inner susceptor and the outer susceptor;
a rotating mechanism configured to rotate the wafer; and
a push-up pin configured to penetrate the heater and to vertically move the inner susceptor.

5. The apparatus according to claim 4, wherein the convex portion is formed to have a high central portion and a low peripheral portion.

6. The apparatus according to claim 5, wherein the high central portion is formed to have a planar disk-like shape.

* * * * *

UNITED STATES PATENT AND TRADEMARK OFFICE
CERTIFICATE OF CORRECTION

| | |
|---|---|
| PATENT NO. | : 8,999,063 B2 |
| APPLICATION NO. | : 12/434317 |
| DATED | : April 7, 2015 |
| INVENTOR(S) | : Ito |

It is certified that error appears in the above-identified patent and that said Letters Patent is hereby corrected as shown below:

In the Claims

Claim 4, column 8, line 14, change "between a to surface" to --between a top surface--.

Signed and Sealed this
Eighth Day of September, 2015

Michelle K. Lee
*Director of the United States Patent and Trademark Office*